(12) United States Patent
Chiu et al.

(10) Patent No.: US 11,264,231 B2
(45) Date of Patent: Mar. 1, 2022

(54) METHOD FOR MANUFACTURING BACKSIDE METALIZED COMPOUND SEMICONDUCTOR WAFER

(71) Applicant: XIAMEN SANAN INTEGRATED CIRCUIT CO., LTD., Fujian (CN)

(72) Inventors: Tsung-Te Chiu, Fujian (CN);
Bing-Han Chuang, Fujian (CN);
Houng-Chi Wei, Fujian (CN)

(73) Assignee: Xiamen Sanan Integrated Circuit Co., Ltd., Fujian (CN)

( * ) Notice: Subject to any disclaimer, the term of this patent is extended or adjusted under 35 U.S.C. 154(b) by 0 days.

(21) Appl. No.: 16/745,705

(22) Filed: Jan. 17, 2020

(65) Prior Publication Data

US 2020/0152445 A1 May 14, 2020

Related U.S. Application Data

(63) Continuation-in-part of application No. PCT/CN2018/086009, filed on May 8, 2018.

(30) Foreign Application Priority Data

Jul. 27, 2017 (CN) .......................... 201710624897.9

(51) Int. Cl.
*H01L 21/02* (2006.01)
*H01L 21/768* (2006.01)
*H01L 23/00* (2006.01)

(52) U.S. Cl.
CPC .. *H01L 21/02016* (2013.01); *H01L 21/02013* (2013.01); *H01L 21/76894* (2013.01); *H01L 24/83* (2013.01); *H01L 24/94* (2013.01)

(58) Field of Classification Search
CPC ......... H01L 21/02016; H01L 21/02013; H01L 21/76894; H01L 24/83; H01L 24/94; H01L 21/76898; H01L 21/683; H01L 21/78
See application file for complete search history.

(56) References Cited

U.S. PATENT DOCUMENTS 8,802,553 B2 * 8/2014 Heinrich ................. H01L 24/05
438/612

FOREIGN PATENT DOCUMENTS

| CN | 101335247 A | 12/2008 |
| CN | 101632160 A | 1/2010 |
| CN | 103703554 A | 4/2014 |

OTHER PUBLICATIONS

Search Report issued to PCT application No. PCT/CN2018/086009 by the CNIPA dated Aug. 1, 2018 (4 pages).

* cited by examiner

*Primary Examiner* — Cuong B Nguyen
(74) *Attorney, Agent, or Firm* — Michael Best & Friedrich LLP

(57) ABSTRACT

A method for manufacturing a backside metalized compound semiconductor wafer includes the steps of: providing a compound semiconductor wafer; attaching the compound semiconductor wafer to a supporting structure; forming an adhesion layer including nickel and vanadium on a back surface of the compound semiconductor wafer; forming an alloy layer including titanium and tungsten on the adhesion layer; forming a metallization layer including gold on the alloy layer; and removing the supporting structure from the compound semiconductor wafer to obtain the backside metalized compound semiconductor wafer.

20 Claims, 2 Drawing Sheets

METHOD FOR MANUFACTURING BACKSIDE METALIZED COMPOUND SEMICONDUCTOR WAFER

CROSS-REFERENCE TO RELATED APPLICATION

This application is a continuation-in-part application of PCT International Application No. PCT/CN2018/086009 filed on May 8, 2018, which claims priority of Chinese Invention Patent Application No. 201710624897.9, filed on Jul. 27, 2017. The entire content of each of the international and Chinese patent applications is incorporated herein by reference.

FIELD

The present disclosure relates to a method for manufacturing semiconductor wafer, and more particularly to a method for manufacturing a backside metalized compound semiconductor wafer.

BACKGROUND

Semiconductor electronic devices, such as a heterojunction bipolar transistor (HBT) and a high electron mobility transistor (HEMT), have important applications in microwave technology, millimeter wave radiation, optoelectronics, etc. Manufacturers of advanced, multifunctional semiconductor electronic products should consider not only the performance of integrated circuit contained therein, but also reduction of manufacturing cost thereof.

Processing a back surface of a semiconductor wafer (i.e., back surface metallization) is one of the key steps in the manufacturing of the semiconductor electronic device. Regardless of the type and function of the semiconductor electronic device, it is necessary to provide a ground pad structure for transistors that are formed on a front surface of the semiconductor wafer. The ground pad structure includes a front metallization layer and a back metallization layer respectively disposed on the front surface and the back surface of the semiconductor wafer, and at least one via formed between and electrically connecting with the front and back metallization layers. Generally, the front metallization layer is first disposed on the front surface of the semiconductor wafer, and then the semiconductor wafer is subjected to mechanical grinding to reduce the thickness thereof. Afterwards, the via is formed from the back surface of the semiconductor wafer by an etching process (such as photolithography, dry etching and wet etching), followed by disposing the back metallization layer on the back surface of the semiconductor wafer to electrically connect the back metallization layer with the front metallization layer through the via. Due to such connection, the front metallization layer also functions as a heatsink by thermally conducting the heat generated by the semiconductor wafer.

After the back surface metallization, the thus disposed back metallization layer is subjected to photolithography to form a plurality of spaced-apart trenches, and then the semiconductor wafer is separated from a supporting material that holds the semiconductor wafer by heating or using solvent, followed by cutting (i.e., mechanical sawing) the semiconductor wafer along the trenches so as to obtain a plurality of semiconductor devices (i.e., dies). Photolithography is a cumbersome process with many steps for forming the back metallization layer, and requires chemical etching that involves use of chemical reagents and liquid waste treatment, while conventional mechanical sawing process is incapable of dicing the back metallization layer having a thickness of more than 5 μm. Usage of both of these processes would inevitably increase the time, cost and labor for manufacturing the semiconductor electronic device.

On the other hand, dicing process with a laser beam has been developed to directly cut the back metallization layer of the semiconductor wafer. However, such technique presents other problems in the manufacturing of a compound semiconductor device in which a metallization layer is formed on the back surface of a compound semiconductor wafer, such as in the manufacturing of a gallium arsenide wafer in which a titanium tungsten/gold composite layer is formed on the back surface thereof. For example, the peripheral region of the contact surfaces between the titanium tungsten/gold composite layer and the gallium arsenide wafer is susceptible to peeling after the dicing process due to weak van der Waals force formed therebetween, as well as non-uniform corrosion that causes discoloration, which subsequently affects the quality and reliability of the thus manufactured compound semiconductor device.

SUMMARY

Therefore, an object of the present disclosure is to provide a method for manufacturing a backside metalized compound semiconductor wafer that can alleviate at least one of the drawbacks of the prior art.

According to one aspect of the present disclosure, the method for manufacturing the backside metalized compound semiconductor wafer includes the steps of:

(a) providing a compound semiconductor wafer having opposite front and back surfaces;

(b) attaching the front surface of the compound semiconductor wafer to a supporting structure;

(c) forming an adhesion layer on the back surface of the compound semiconductor wafer, the adhesion layer including nickel in an amount ranging from 90 wt % to 97 wt % and vanadium in an amount ranging from 3 wt % to 10 wt %, based on a total weight of the adhesion layer;

(d) forming an alloy layer that includes titanium tungsten on the adhesion layer;

(e) forming a metallization layer that includes gold on the alloy layer; and (f) removing the supporting structure from the front surface of the compound semiconductor wafer, so as to obtain a backside metalized compound semiconductor wafer.

Another object of the present disclosure is to provide a backside metalized compound semiconductor wafer that can alleviate at least one of the drawbacks of the prior art.

According to another aspect of the present disclosure, the backside metalized compound semiconductor wafer manufactured by the abovementioned method includes the compound semiconductor wafer, the adhesion layer, the alloy layer, and the metallization layer. The compound semiconductor wafer has opposite front and back surfaces. The adhesion layer is formed on the back surface of the compound semiconductor wafer, and includes nickel in an amount ranging from 90 wt % to 97 wt % and vanadium in an amount ranging from 3 wt % to 10 wt %, based on a total weight of the adhesion layer. The alloy layer is formed on the adhesion layer opposite to the compound semiconductor wafer, and includes titanium tungsten. The metallization layer is formed on the alloy layer opposite to the adhesion layer, and includes gold.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
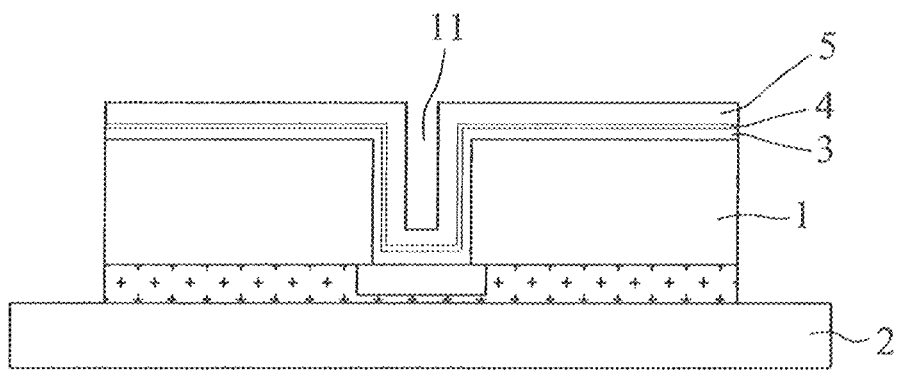
FIG. 1 is a schematic view showing a backside metalized compound semiconductor wafer that is made by an embodiment of a method for manufacturing the backside metalized compound semiconductor wafer according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a method for manufacturing a backside metalized compound semiconductor wafer includes steps (a) to (f).

In step (a), a compound semiconductor wafer 1 having opposite front and back surfaces is provided. The manufacture and configuration of the compound semiconductor wafer 1 are well-known to those skilled in the art, and would only be briefly discussed for the sake of brevity. The compound semiconductor wafer 1 obtained from a front surface metallization process may include a device region that is adjacent to the front surface and that may consist of transistors, resistors, capacitors, inductors, etc., for forming integrated circuits, and a plurality of front metallization layers that are disposed over the device region and which include metal lines and vias for electrically connecting the device region with external or adjacent circuits on the compound semiconductor wafer 1.

In addition, the compound semiconductor wafer 1 may be made of a group III-V semiconductor material. Examples of the group III-V semiconductor material may include, but are not limited to, gallium arsenide, indium phosphide, gallium nitride, and combinations thereof.

In step (b), the front surface of the compound semiconductor wafer 1 is attached to a supporting structure 2.

In step (c), an adhesion layer 3 is formed on the back surface of the compound semiconductor wafer 1, and includes nickel in an amount ranging from 90 wt % to 97 wt % and vanadium in an amount ranging from 3 wt % to 10 wt %, based on a total weight of the adhesion layer 3. The adhesion layer 3 may have a thickness ranging from 3 nm to 200 nm. The adhesion layer 3 may be formed by magnetron sputtering.

In certain embodiments, before step (c), the compound semiconductor wafer 1 is subjected to wafer grinding, followed by forming at least one via 11 that extends from the back surface into the compound semiconductor wafer 1. In certain embodiments, the compound semiconductor wafer 1 is grinded to a thickness ranging from 70 μm to 120 μm.

In step (d), an alloy layer 4 that includes titanium and tungsten is formed on the adhesion layer 3. The alloy layer 4 may have a thickness ranging from 2 nm to 10 nm. The alloy layer 4 may be formed by magnetron sputtering.

In step (e), a metallization layer 5 that includes gold is formed on the alloy layer 4. The metallization layer 5 may have a thickness ranging from 0.5 μm to 25 μm. In certain embodiments, the metallization layer 5 includes a seed sublayer of gold having a thickness ranging from 10 nm to 250 nm that is formed on the alloy layer 4, and an electroplated sublayer of gold that is formed on the seed sublayer of gold.

In step (f), the supporting structure 2 is removed from the front surface of the compound semiconductor wafer 1, so as to obtain a backside metalized compound semiconductor wafer.

The embodiment of the method of the present disclosure further includes step (g), in which the backside metalized compound semiconductor wafer is subjected to a dicing process with a laser beam, so as to obtain a plurality of the compound semiconductor devices that are separated from one another.

In certain embodiments, the dicing process includes a first cutting step of cutting the backside metalized compound semiconductor wafer from the metallization layer 5 so as to form a plurality of spaced-apart trenches 6 that extend from the metallization layer 5 into the compound semiconductor wafer 1, and a second cutting step of cutting the backside metalized compound semiconductor wafer along the trenches 6 so as to obtain the compound semiconductor devices. Each of the trenches 6 may have a depth that ranges from 40% to 60% of a total thickness of the backside metalized compound semiconductor wafer. The dicing process may be performed at a speed ranging from 100 mm/s to 400 mm/s, and the laser beam may have a power ranging from 3.0 W to 6.5 W.

In certain embodiments, the laser beam is irradiated onto the backside metalized compound semiconductor wafer in a direction substantially perpendicular to the back surface of the compound semiconductor wafer 1. In the first cutting step, the laser beam is moved along a first direction so as to form a first group of trenches 61 that are arranged parallel to each other and extend in the first direction, and along a second direction that is perpendicular to the first direction so as to form a second group of trenches 62 that are arranged parallel to each other and extend in the second direction.

Referring back to FIG. 1, the backside metalized compound semiconductor wafer that is manufactured by the method of the present disclosure includes the compound semiconductor wafer 1, the adhesion layer 3, the alloy layer 4, and the metallization layer 5. The compound semiconductor wafer 1 has opposite front and back surfaces. The adhesion layer 3 is formed on the back surface of the compound semiconductor wafer 1, and includes nickel in an amount ranging from 90 wt % to 97 wt % and vanadium in an amount ranging from 3 wt % to 10 wt %, based on a total weight of the adhesion layer 3. The alloy layer 4 is formed on the adhesion layer 3 opposite to the compound semiconductor wafer 1, and includes titanium tungsten. The metallization layer 5 is formed on the alloy layer 4 opposite to the adhesion layer 3, and includes gold.

In this embodiment, the compound semiconductor wafer 1 is made from gallium arsenide (i.e., a gallium arsenide wafer 1). The front surface, which has been metalized, is attached to the supporting structure 2, and then the gallium arsenide wafer 1 is grinded to a thickness of 100 μm, followed by a photolithography to form the vias 11 that extend from the back surface into the gallium arsenide wafer 1. After removal of etch residue from the back surface of the gallium arsenide wafer 1, the adhesion layer 3 which includes nickel and vanadium (i.e., nickel-vanadium layer 3) and which has a thickness of 100 nm is disposed on the back surface by magnetron sputtering, in which nickel is present in an amount of 93 wt % and vanadium is present in an amount of 7 wt % based on the total weight of the nickel-vanadium layer 3, and then the alloy layer 4 which includes titanium and tungsten (i.e., titanium-tungsten layer 4) and which has a thickness of 6 nm is disposed on the nickel-vanadium layer 3 by magnetron sputtering. Subsequently, the metalization layer 5 including gold (i.e., gold layer 5) is disposed on the titanium-tungsten layer 4, in which the seed sublayer of gold having a thickness of 100 nm is first disposed by a sputtering method that is selected from the group consisting of RF magnetron, DC magnetron, RF diode, ion beam, and electron beam, and then the electroplated sublayer of gold having a thickness of m is disposed on the seed sublayer of gold by an electroplating process.

It should be noted that when nickel is to be deposited on the surface of the gallium arsenide wafer 1 under a relatively low temperature by magnetron sputtering, nickel is capable of interacting with gallium arsenide to form nickel gallium and nickel arsenide. That is, the nickel-vanadium layer 3 may be chemically bonded to the gallium arsenide wafer 1. Compared to other metals (other than nickel) which interact with the gallium arsenide wafer 1 via van der waals force, the binding between the gallium arsenide wafer 1 and the nickel-vanadium layer 3 is much stronger, and thus, the nickel-vanadium layer 3 is not easily peeled off from the gallium arsenide wafer 1 by external forces. Addition of a certain amount of vanadium to the nickel enables the thus formed nickel-based alloy to become non-magnetic, which may facilitate magnetron sputtering. Furthermore, the titanium-tungsten layer 4 not only forms relatively strong binding with the nickel-vanadium layer 3 and the gold layer 5, but also serves as a diffusion barrier to prevent gold from diffusing into the gallium arsenide wafer 1. By disposing the nickel-vanadium layer 3 and the titanium-tungsten layer 4 on the gallium arsenide wafer 1, the binding force thereamong can be greatly improved.

Figure 2:
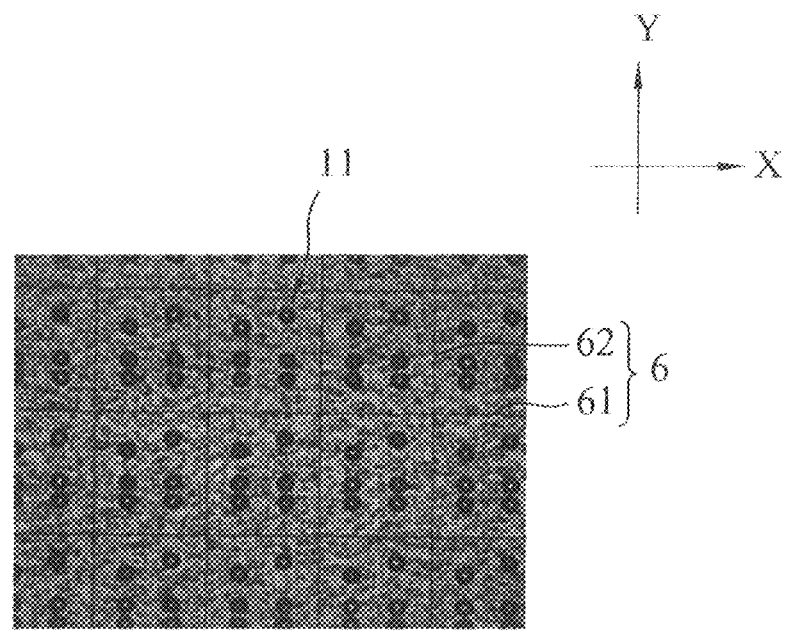
FIG. 2 is an optical microscopy image of a plurality of compound semiconductor devices obtained after a dicing process.
Figure 3:
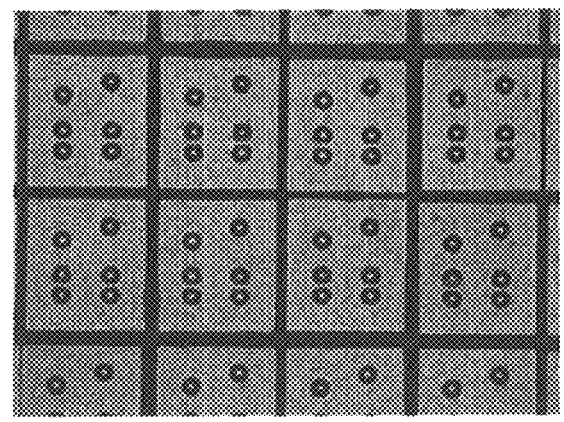
FIG. 3 is an optical microscopy image of the compound semiconductor devices that are separated from one another.
Figure 4:
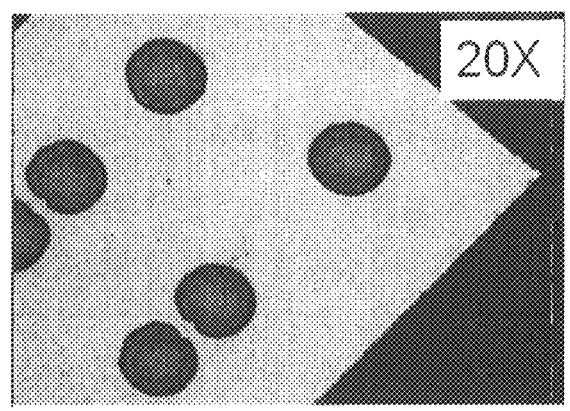
FIG. 4 is an enlarged optical microscopy image of a single compound semiconductor device from FIG. 3.

After the gold layer 5 is disposed on the titanium-tungsten layer 4, the supporting material 2 is removed from the gallium arsenide wafer 1 by heating or using an organic solvent (such as acetone or isopropyl alcohol), so as to obtain a backside metalized gallium arsenide wafer. The front surface of the backside metalized gallium arsenide wafer is then attached to a substrate that is stretchable and that has adhesive property, and the back surface thereof is subjected to the dicing process with the laser beam. Referring to FIG. 2, in the first cutting step of the dicing process, the gold layer 5 of the backside metalized gallium arsenide wafer is cut along the X direction and the Y direction that is perpendicular to the X direction, so as to form a first group of spaced apart trenches 61 extending in the X direction, and a second group of spaced apart trenches 62 extending in the Y direction. In this embodiment, each of the first and second groups of trenches 61,62 has a depth of approximately 50% of the total thickness of the backside metalized gallium arsenide wafer, such as about 55 μm. In the second cutting step of the dicing process, the backside metalized gallium arsenide wafer is cut along the trenches extending in the X and Y directions until the substrate is exposed, so as to obtain a plurality of gallium arsenide semiconductor devices. The dicing process is conducted at a speed of 100 mm/s to 400 mm/s, and the laser beam has a power of 3.0 W to 6.5 W. After the dicing process, the substrate is stretched so that the gallium arsenide semiconductor devices are separated from one another (see FIG. 3). The peripheral region of each of the thus obtained gallium arsenide semiconductor devices is smooth without occurrence of metal peeling and discoloration defect due to non-uniform corrosion (see FIG. 4).

In summary, by virtue of forming the adhesion layer 3 including nickel and vanadium and the alloy layer 4, the bonding force between the compound semiconductor wafer 1 and the metallization layer 5 on the back surface thereof can be enhanced such that the backside metalized compound semiconductor wafer can be directly subjected to the dicing process without the need of etching prior to the cutting steps, thereby reducing the manufacturing cost and time so as to improve the manufacturing yield of the thus obtained compound semiconductor devices.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for manufacturing a backside metalized compound semiconductor wafer, comprising the steps of:
   (a) providing a compound semiconductor wafer having opposite front and back surfaces;
   (b) attaching the front surface of the compound semiconductor wafer to a supporting structure;
   (c) forming an adhesion layer on the back surface of the compound semiconductor wafer, the adhesion layer including nickel in an amount ranging from 90 wt % to 97 wt % and vanadium in an amount ranging from 3 wt % to 10 wt %, based on a total weight of the adhesion layer;
   (d) forming an alloy layer that includes titanium tungsten on the adhesion layer;
   (e) forming a metallization layer that includes gold on the alloy layer; and
   (f) removing the supporting structure from the front surface of the compound semiconductor wafer, so as to obtain the backside metalized compound semiconductor wafer.

2. The method as claimed in claim 1, further comprising step (g), wherein the backside metalized compound semiconductor wafer is subjected to a dicing process with a laser beam, so as to obtain a plurality of compound semiconductor devices that are separated from one another.

3. The method as claimed in claim 2, wherein in step (g), the dicing process includes a first cutting step of cutting the backside metalized compound semiconductor wafer from the metallization layer so as to form a plurality of spaced-apart trenches that extend from the metallization layer into the compound semiconductor wafer, and a second cutting step of cutting the backside metalized compound semiconductor wafer along the plurality of spaced-apart trenches so as to obtain the plurality of separated compound semiconductor devices.

4. The method as claimed in claim 3, wherein in step (g), each of the plurality of spaced-apart trenches has a depth that ranges from 40% to 60% of a total thickness of the backside metalized compound semiconductor wafer.

5. The method as claimed in claim 1, wherein the adhesion layer has a thickness ranging from 3 nm to 200 nm.

6. The method as claimed in claim 1, wherein the alloy layer has a thickness ranging from 2 nm to 10 nm.

7. The method as claimed in claim 1, wherein the metallization layer has a thickness ranging from 0.5 μm to 25 μm.

8. The method as claimed in claim 2, wherein in step (g), the dicing process is performed at a speed ranging from 100 mm/s to 400 mm/s, and the laser beam has a power ranging from 3.0 W to 6.5 W.

9. The method as claimed in claim 2, wherein in step (g), the laser beam is irradiated onto the backside metalized compound semiconductor wafer in a direction substantially perpendicular to the back surface of the compound semiconductor wafer.

10. The method as claimed in claim 1, wherein before step (c), the compound semiconductor wafer is subjected to wafer grinding, followed by forming at least one via extending from the back surface into the compound semiconductor wafer.

11. The method as claimed in claim 10, wherein the compound semiconductor wafer is grinded to a thickness ranging from 70 μm to 120 μm.

12. The method as claimed in claim 3, wherein in the first cutting step, the laser beam is moved along a first direction and along a second direction that is substantially perpendicular to the first direction.

13. The method as claimed in claim 1, wherein in step (e), the metallization layer includes a seed sublayer of gold having a thickness ranging from 10 nm to 250 nm formed on the alloy layer, and an electroplated sublayer of gold formed on the seed sublayer of gold.

14. The method as claimed in claim 1, wherein in steps (c) and (d), the adhesion layer and the alloy layer are formed by magnetron sputtering.

15. The method as claimed in claim 1, wherein in step (a), the compound semiconductor wafer is made of a group III-V semiconductor material.

16. The method as claimed in claim 15, wherein the group III-V semiconductor material is selected from the group consisting of gallium arsenide, indium phosphide, and gallium nitride.

17. A backside metalized compound semiconductor wafer manufactured by the method as claimed in claim 1, comprising:
said compound semiconductor wafer having opposite front and back surfaces;
said adhesion layer formed on said back surface of said compound semiconductor wafer, said adhesion layer including nickel in the amount ranging from 90 wt % to 97 wt % and vanadium in the amount ranging from 3 wt % to 10 wt %, based on a total weight of said adhesion layer;
said alloy layer formed on said adhesion layer opposite to said compound semiconductor wafer, and including titanium tungsten; and
said metallization layer formed on said alloy layer opposite to said adhesion layer, and including gold.

18. The backside metalized compound semiconductor wafer as claimed in claim 17, wherein said adhesion layer has a thickness ranging from 3 nm to 200 nm.

19. The backside metalized compound semiconductor wafer as claimed in claim 17, wherein said alloy layer has a thickness ranging from 2 nm to 10 nm.

20. The backside metalized compound semiconductor wafer as claimed in claim 17, wherein said metallization layer has a thickness ranging from 0.5 μm to 25 μm.

* * * * *